(12) United States Patent
Matsushita et al.

(10) Patent No.: US 11,996,586 B2
(45) Date of Patent: May 28, 2024

(54) CIRCUIT BOARD SOLDERING STRUCTURE

(71) Applicant: SANYO Electric Co., Ltd., Kadoma (JP)

(72) Inventors: Fumiya Matsushita, Osaka (JP); Shota Matsubara, Osaka (JP)

(73) Assignee: PANASONIC ENERGY CO., LTD., Osaka (JP)

( * ) Notice: Subject to any disclaimer, the term of this patent is extended or adjusted under 35 U.S.C. 154(b) by 46 days.

(21) Appl. No.: 17/780,800

(22) PCT Filed: Nov. 13, 2020

(86) PCT No.: PCT/JP2020/042359
§ 371 (c)(1),
(2) Date: May 27, 2022

(87) PCT Pub. No.: WO2021/111843
PCT Pub. Date: Jun. 10, 2021

(65) Prior Publication Data
US 2022/0416370 A1    Dec. 29, 2022

(30) Foreign Application Priority Data

Dec. 3, 2019   (JP) ................................. 2019-218562

(51) Int. Cl.
*H01M 50/503*     (2021.01)
*H01M 50/519*     (2021.01)
(Continued)

(52) U.S. Cl.
CPC ....... *H01M 50/519* (2021.01); *H01M 50/503* (2021.01); *H01M 50/522* (2021.01); *H05K 1/02* (2013.01); *H05K 2201/09063* (2013.01)

(58) Field of Classification Search
CPC .. H01M 10/04; H01M 50/503; H01M 50/519; H01M 50/522; H05K 1/02;
(Continued)

(56) References Cited

U.S. PATENT DOCUMENTS

| 5,618,187 A | 4/1997 | Goto |
| 2009/0246615 A1* | 10/2009 | Park ........................ H05K 3/308 |
| | | 429/209 |
| 2021/0167456 A1 | 6/2021 | Kurihara et al. |

FOREIGN PATENT DOCUMENTS

| JP | 55-137582 U | 9/1980 | |
| JP | 55137582 U * | 9/1980 | ............... H05K 1/02 |

(Continued)

OTHER PUBLICATIONS

International Search Report dated Jan. 12, 2021, issued in counterpart International Application No. PCT/JP2020/042359. (3 pages).
(Continued)

*Primary Examiner* — Timothy J Thompson
*Assistant Examiner* — Guillermo J Egoavil
(74) *Attorney, Agent, or Firm* — WHDA, LLP

(57) ABSTRACT

A circuit board soldering structure includes lead a plate inserted into a slit hole of a circuit board and soldered to a conductive pattern provided along the slit hole. The lead plate is made of an elastically-deformable metal plate thinner than an opening width (W) of slit hole. The lead plate includes insertion section inserted into the slit hole. The insertion section includes a bent section approaching from one of opposing inner surfaces of the slit hole facing each other toward another of the opposing inner surfaces of the slit hole. The bent section is disposed in the slit hole. The insertion section has both surfaces that are close to or contact corresponding opposing inner surfaces of the slit hole to solder the insertion section to the conductive pattern.

7 Claims, 10 Drawing Sheets

(51) Int. Cl.
*H01M 50/522* (2021.01)
*H05K 1/02* (2006.01)

(58) Field of Classification Search
CPC .......... H05K 2201/09063; H05K 2201/10037;
H05K 2201/10295; H05K 2201/1034;
H05K 2201/1078; H05K 2201/10787;
H05K 3/3405
USPC ................................ 174/255; 429/149, 209
See application file for complete search history.

(56) References Cited

FOREIGN PATENT DOCUMENTS

| | | | | | |
|---|---|---|---|---|---|
| JP | S55137582 U | * | 9/1980 | ............... | H05K 1/02 |
| JP | 63-187348 U | | 11/1988 | | |
| JP | 1-97562 U | | 6/1989 | | |
| JP | H0197562 U | * | 6/1989 | ............. | H01L 23/50 |
| JP | 4-28285 A | | 1/1992 | | |
| JP | 6-45743 A | | 2/1994 | | |
| JP | 2010-277796 A | | 12/2010 | | |
| JP | 2011-187915 A | | 9/2011 | | |
| JP | 2011187915 A | * | 9/2011 | ............... | H05K 1/18 |
| WO | 2019/208217 A1 | | 10/2019 | | |

OTHER PUBLICATIONS

Extended European Search Report dated May 8, 2023, issued in counterpart EP Application No. 20896476.7. (7 pages).

\* cited by examiner

CIRCUIT BOARD SOLDERING STRUCTURE

CROSS-REFERENCE TO RELATED APPLICATIONS

This application is a national stage of International Application No. PCT/JP2020/042359, filed Nov. 13, 2020, which claims priority to Japanese Patent Application No. 2019-218562 filed Dec. 3, 2019 both of which are hereby incorporated by reference in their entirety.

TECHNICAL FIELD

The present invention relates to a circuit board soldering structure, and more particularly to a circuit board soldering structure in which a lead plate is inserted into a slit hole provided in the circuit board and soldered to a conductive pattern on an outer peripheral edge of the slit hole.

BACKGROUND ART

A structure in which a lead plate of a metal plate is inserted into a slit hole provided in a circuit board, and the lead plate is soldered and connected to a conductive pattern of the circuit board, increases a contact area between the lead plate and the conductive pattern of the circuit board to achieve excellent large current characteristics. It is important for this soldering structure to solder the lead plate to the conductive pattern provided along an inner peripheral edge of the slit hole reliably and stably in a wide area. Soldering structures that achieve this soldering have been developed (PTL 1).

FIG. 10 illustrates this soldering structure in which metal plate 102 as a lead plate is inserted into slit hole 103A provided in circuit board 103, slit hole 103A having an inner surface covered with metal film 105, and is immersed in a solder bath to achieve soldering with solder 106.

CITATION LIST

Patent Literature
PTL 1: Japanese Patent Laid-Open Publication No. 6-45743

SUMMARY OF THE INVENTION

Technical Problem to be Solved

The above soldering structure includes a lead plate, the metal plate, and allows the lead plate to be soldered to the circuit board. This soldering structure causes heated molten solder to flow into a gap formed between the lead plate and the inner surface of the slit hole so that the molten solder comes into close contact with both a surface of the lead plate and the metal film on the inner surface of the slit hole to achieve soldering. It is important for the molten solder having flowed into the gap to be cooled and strongly brought into close contact with the surfaces of both the lead plate and the metal film to achieve electrical connection. This state is not achieved by simply causing the molten solder to flow into the gap for soldering, and requires the molten solder having flown into the gap to heat both the surfaces of the lead plate and the metal film to a predetermined temperature. The molten solder having flowed into the gap for solder contacts the surfaces of the lead plate and the metal film and has a temperature decreased, preventing reliable soldering. This is because soldering forms an alloy layer at an interface between solder and metal and strongly joins the solder to the metal. The joining in this state requires the molten solder having flown into the gap for soldering to be maintained at a temperature higher than a temperature at which the alloy layer is formed. The molten solder held at this temperature in the gap for solder easily flows, and thus, flows down from the gap for solder to cause various adverse effects. For example, the molten solder causes heat damage to a component disposed below the circuit board or drips and is cooled to have a granular shape to form a solder ball that short-circuits an electronic circuit disposed below the circuit board, thereby causing a failure.

The present invention has been developed to solve the above disadvantages, and an object of the present invention is to provide a circuit board soldering structure capable of preventing the adverse effect of molten solder flowing down while reliably and stably connecting a circuit board to a lead plate.

Solution to Problem

A circuit board soldering structure according to an aspect of the present invention includes a lead plate inserted into a slit hole of the circuit board soldered to a conductive pattern provided along the slit hole. The lead plate is made of an elastically-deformable metal plate thinner than an opening width of the slit hole. The lead plate includes an insertion section inserted into the slit hole. The insertion section includes a bent section approaching from one of opposing inner surfaces of the slit hole toward another of the opposing inner surfaces of the slit hole. The bent section is disposed in the slit hole. The insertion section has both surfaces that are close to or contact the opposing inner surfaces of the slit hole to solder the insertion section to the conductive pattern.

Advantageous Effect of Invention

The soldering structure described above has an advantage preventing the adverse effect of molten solder flowing down while the circuit board is reliably and stably connected to the lead plate.

DESCRIPTION OF EMBODIMENT

Figure 1:
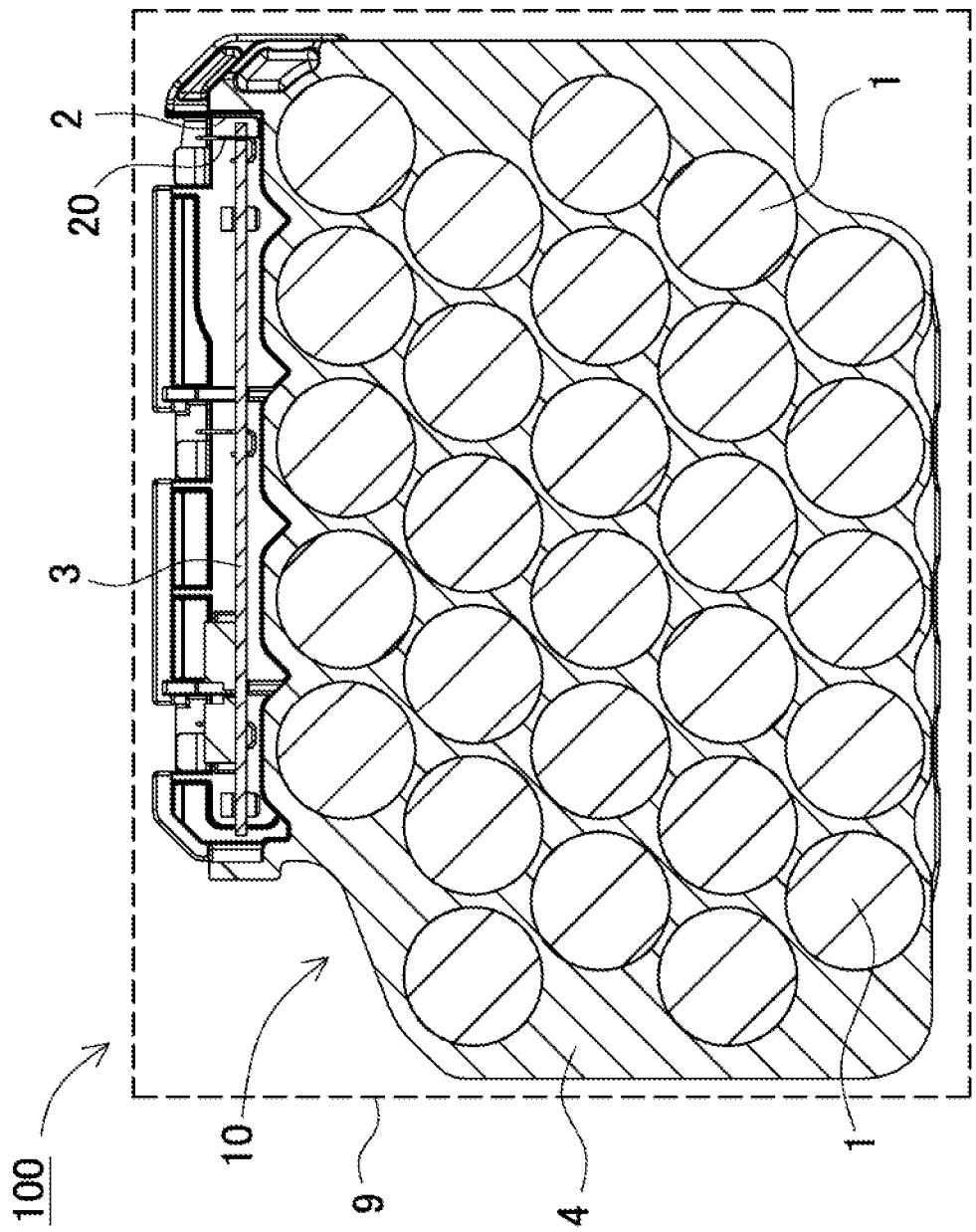
FIG. 1 is a schematic sectional view of a battery pack according to an exemplary embodiment of the present invention.

Exemplary embodiments of the present invention will be described below.

A circuit board soldering structure according to a first exemplary embodiment of the present invention includes a lead plate inserted into a slit hole of the circuit board and soldered to a conductive pattern provided along the slit hole. The lead plate is an elastically-deformable metal plate thinner than an opening width of the slit hole. The lead plate includes an insertion section inserted into the slit hole. The insertion section having a bent section approaching from one of opposing inner surfaces of the slit hole toward another of the opposing inner surfaces of the slit hole. The bent section is disposed in the slit hole. The insertion section has both surfaces that are close to approach or contact the opposing inner surfaces of the slit hole to solder the insertion section to the conductive pattern.

The soldering structure described above allows the bent section of the lead plate to narrow a gap between the lead plate and the slit hole while the lead plate of the metal plate is inserted into the slit hole. This configuration provides an advantage preventing molten solder flowing into the gap between the lead plate and the slit hole from flowing down from the slit hole. In particular, the soldering structure described above allows the lead plate to be soldered to the conductive pattern while preventing the molten solder from flowing down from the slit hole. This configuration has an advantage in that the lead plate can be reliably soldered to the conductive pattern by holding the molten solder flowing into the slit hole in a molten state. The molten solder is not joined immediately after contacting a surface of the metal to be soldered, and achieves soldering by heating the surface of the metal in contact to form an alloy layer at an interface with the metal. Although the molten solder at high temperature that heats the surface of the metal to form the alloy layer has preferable fluidity and is likely to flow down from the slit hole, the above soldering method prevents the molten solder with high flowability from flowing down from the slit hole, and thus enabling the molten solder to achieve reliable soldering while the molten solder is maintained at high temperature.

A circuit board soldering structure according to a second exemplary embodiment of the present invention includes a bent section bent o have a stepped shape.

The soldering structure described above has advantages as follows: the bent section is formed by bending an elastically-deformable metal plate into a stepped shape, and thus, enabling bending to be facilitated and manufacturing cost to be reduced; and the insertion section of the lead plate has both surfaces disposed close to the corresponding opposing inner surfaces of the slit hole in a wide area, and thus enabling the molten solder to flow between the slit hole and the insertion section without leakage, thereby achieving reliable soldering.

A circuit board soldering structure according to a third exemplary embodiment of the present invention includes a lead plate including a bent section bent to have a chevron shape extending in a longitudinal direction of an inner surface of the slit hole.

The soldering structure described above has an advantage of enabling reliable soldering to be achieved by bringing the bent section in a chevron shape close to the opposing inner surfaces in a long region of the slit hole while the insertion section is inserted vertically into the slit hole.

A circuit board soldering structure according to a fourth exemplary embodiment of the present invention includes a bent section bent to have a chevron shape having a lateral width smaller than a thickness of the circuit board.

A circuit board soldering structure according to a fifth exemplary embodiment of the present invention is configured such that solder flows into a gap between the lead plate and each of the inner surfaces of the slit hole while the bent section causes both the surfaces of the lead plate to elastically press corresponding inner surfaces of the slit hole.

The soldering structure described above has an advantage in that the bent section causes both surfaces of the insertion section to elastically press the corresponding opposing surfaces of the slit hole, and thus enabling the lead plate to be smoothly inserted into the slit hole while the gap in the slit hole is reliably closed with the bent section to reliably prevent molten solder from flowing down, thereby achieving reliable soldering.

A circuit board soldering structure according to a sixth exemplary embodiment of the present invention is configured such that the circuit board includes plural slit holes linearly aligned with one another. The lead plate includes plural insertion sections inserted into the respective multiple slit holes. The insertion sections are inserted into the respective slit holes to be soldered to a conductive pattern of the circuit board.

The soldering structure described above causes the lead plate to be inserted into each of the slit holes to achieve soldering, so that the lead plate may be soldered to the circuit board more reliably. The soldering structure also has an advantage in that the slit holes are linearly arranged to allow the lead plate to include the insertion sections branched from one metal plate, thus enabling the insertion sections to be soldered to the corresponding multiple slit holes.

A circuit board soldering structure according to a seventh exemplary embodiment of the present invention is configured as follows. The lead plate includes a placement section for the circuit board. The placement section protrudes in a width direction of the circuit board along a lower surface of the circuit board. The circuit board is placed on the placement section. The bent section is disposed in the slit hole. The placement section is disposed at a position closing an end opening of the slit hole from below.

The above soldering structure determines a relative position of the circuit board to the lead plate by placing the circuit board on the placement section provided on the lead plate, thus disposing the bent section provided in the insertion section in the slit hole. The bent section is disposed at an accurate position in the slit hole to prevent the molten solder from flowing down from the slit hole. It is difficult for a thin circuit board having a thickness of several mm or less to dispose the bent section at an accurate position in the slit hole. Even when the bent section is displaced and disposed outside the slit hole, the molten solder is not prevented from flowing down. The bent section at an accurate position is preferably disposed in the slit hole to solder the lead plate to the circuit board with the molten solder. The soldering structure described above enables the bent section to be reliably disposed at an accurate position in the slit hole by placing the circuit board on the placement section provided on the lead plate to prevent relative position deviation between the circuit board and the lead plate. Thus, the above soldering structure reliably prevents the molten solder from flowing down from the slit hole. The soldering structure described above also prevents the molten solder from flowing down from an end part of the slit hole in the longitudinal direction when the circuit board is placed on the placement section and the placement section is at a position closing an opening formed at the end part of the slit hole from below.

Hereinafter, the present invention will be described in detail with reference to the drawings. Although the description below uses terms (e.g., "up", "down", and other terms including those terms) indicating specific directions or positions as necessary, use of those terms is for facilitating understanding of the invention with reference to the drawings, and the technical scope of the present invention is not limited by the meanings of those terms. Parts denoted by the same reference numerals appearing in a plurality of drawings indicate the same or equivalent parts or members.

An exemplary embodiment described below shows a specific example of the technical idea of the present invention, and the present invention is not limited to the exemplary embodiment below. Unless otherwise specified, dimensions, materials, shapes, relative placements, and the like of components described below are not intended to limit the scope of the present invention only to them, but are intended to be illustrative. The contents described in one exemplary embodiment or one example are also applicable to other exemplary embodiments and examples. The drawings may illustrate members in exaggerated size and positional relationships, for example, to clarify the description.

Exemplary Embodiment 1

Figure 2:
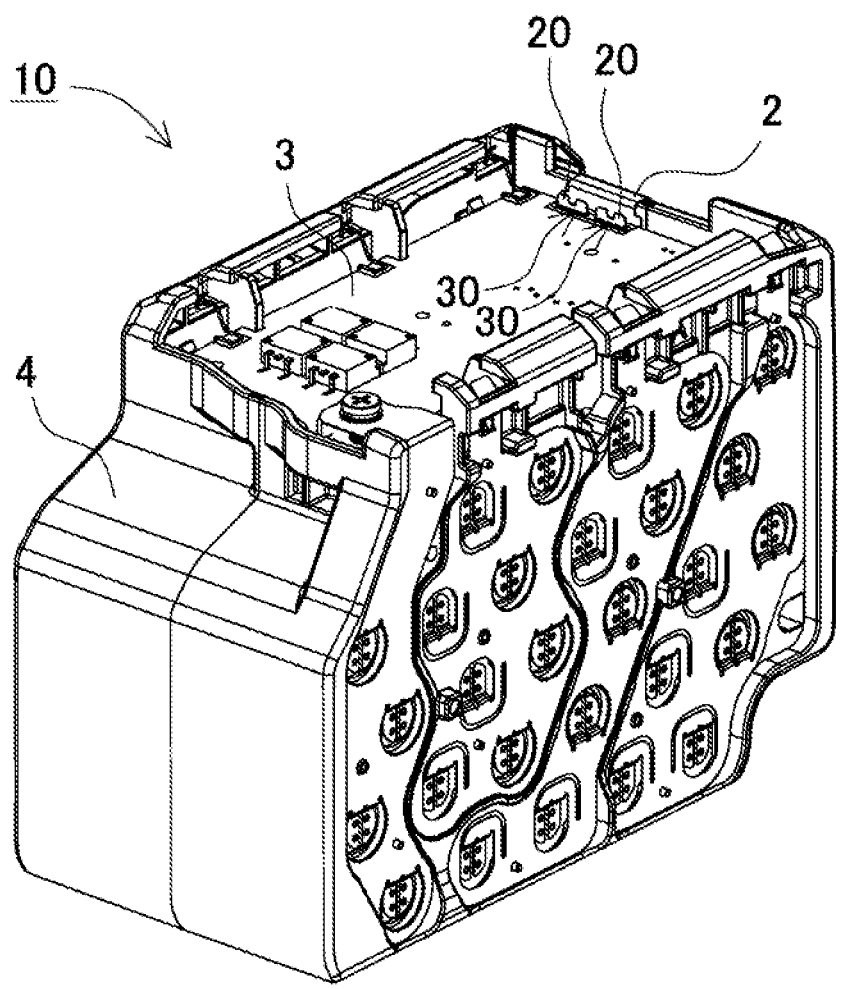
FIG. 2 is a perspective view of a battery unit of the battery pack illustrated in FIG. 1.
Figure 3:
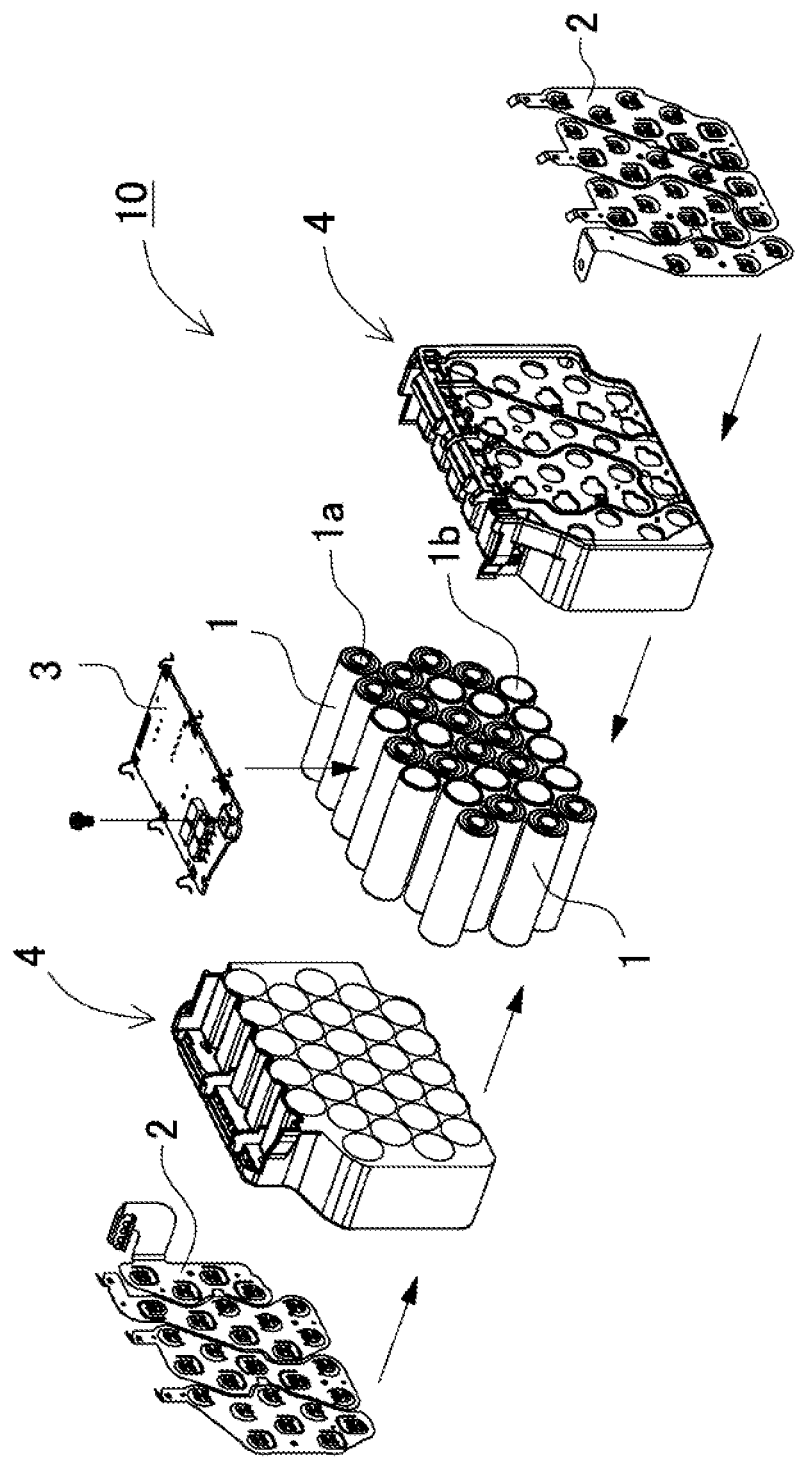
FIG. 3 is an exploded perspective view of the battery unit illustrated in FIG. 2.

FIG. 1 is a schematic sectional view of battery pack 100. FIG. 2 is a perspective view of battery pack 100. FIG. 3 is an exploded perspective view of battery pack 100. In battery pack 100 shown in FIG. 1, FIG. 2, and FIG. 3, rechargeable batteries 1 disposed in parallel, lead plate 2 melted and joined to electrode terminals 1a and 1b of each battery 1, and circuit board 3 to which lead plate 2 is soldered are assembled to constitute battery unit 10. Battery unit 10 is housed in outer case 9. In battery unit 10 shown in FIGS. 2 and 3, batteries 1 with cylindrical shapes are disposed parallel to one another at respective predetermined positions in battery holder 4. Electrode terminals 1a and 1b of each battery 1 are exposed on both end surfaces of battery holder 4. Each lead plate 2 is joined and connected to corresponding one of electrode terminals 1a and 1b.

In battery pack 100 illustrated in the above drawings, a bus bar that is formed by cutting one metal plate and connects batteries 1 in series or in parallel is integrated with lead plate 2 that connects the bus bar to circuit board 3. This structure allows electrode terminals 1a and 1b to be connected to circuit board 3 by one metal plate, and thus reduces electrical resistance of a connecting part to reduce power loss while simplifying a connection structure. Lead plate 2 reduces power loss by being used in a path through which a large current flows, e.g., a path through which charge and discharge currents of battery 1 flow. However, the lead plate may not necessarily be integrated with the bus bar, and the lead plate and the bus bar may be made of separate metal plates. Lead plate 2 connected to circuit board 3 may be used, for example, as a transmission path of a signal or the like without being used as a path through which a large current, such as charge and discharge currents of battery 1, flow. Lead plate 2 used as the transmission path of a signal to circuit board 3 with the following soldering structure provides an advantage of enhancing stability of signal transmission between lead plate 2 and the circuit board.

Figure 4:
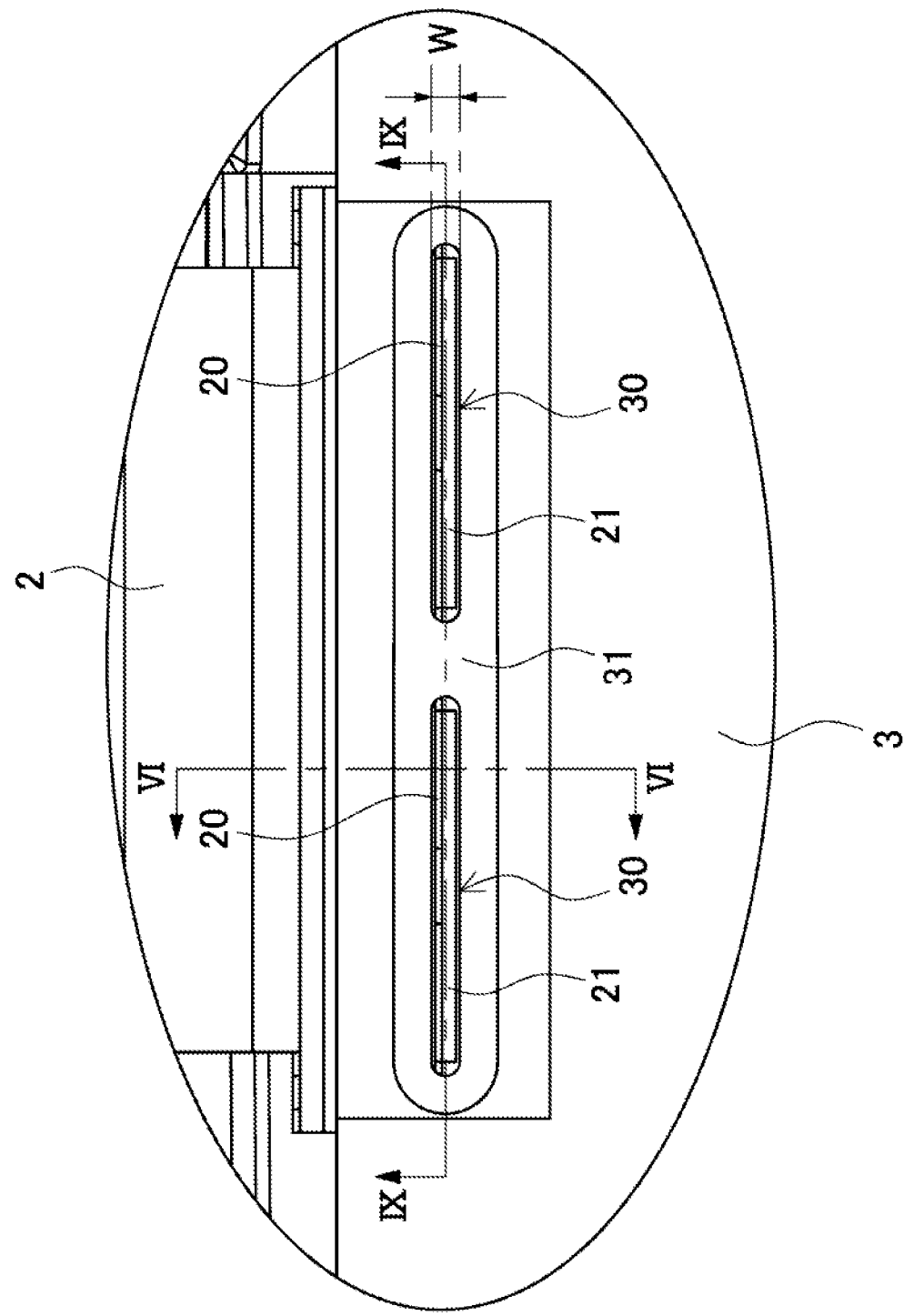
FIG. 4 is an enlarged plan view illustrating a connecting part between a circuit board and a lead plate.

In the soldering structure between lead plate 2 and circuit board 3, slit hole 30 is provided in circuit board 3. Lead plate 2 is inserted into slit hole 30. Lead plate 2 is soldered and connected to conductive pattern 31 provided on circuit board 3. Circuit board 3 includes conductive pattern 31 provided along slit hole 30. Lead plate 2 is soldered to conductive pattern 31 to be connected to circuit board 3. The plan view of FIG. 4 illustrates circuit board 3 having slit hole 30 provided therein conductive pattern 31. Circuit board 3 illustrated in this drawing has plural slit holes 30 aligned linearly, and conductive patterns 31 provided on a surface of circuit board 3. Each of conductive patterns 31 are disposed along an outer periphery of corresponding one of slit holes 30. Conductive pattern 31 is provided on the surface of circuit board 3 with a predetermined lateral width along the entire circumference of each slit hole 30. Conductive pattern 31 may be provided on each of both front and back surfaces of circuit board 3 along the outer periphery of each slit hole 30. Circuit board 3 may preferably have a through-hole structure by providing a conductive pattern on an inner surface of each of slit holes 30 continuously connected to conductive pattern 31 on the front surface. Conductive pattern 31 in a through-hole has an advantage allowing lead plate 2 to be soldered to conductive pattern 31 more reliably.

Figure 5:
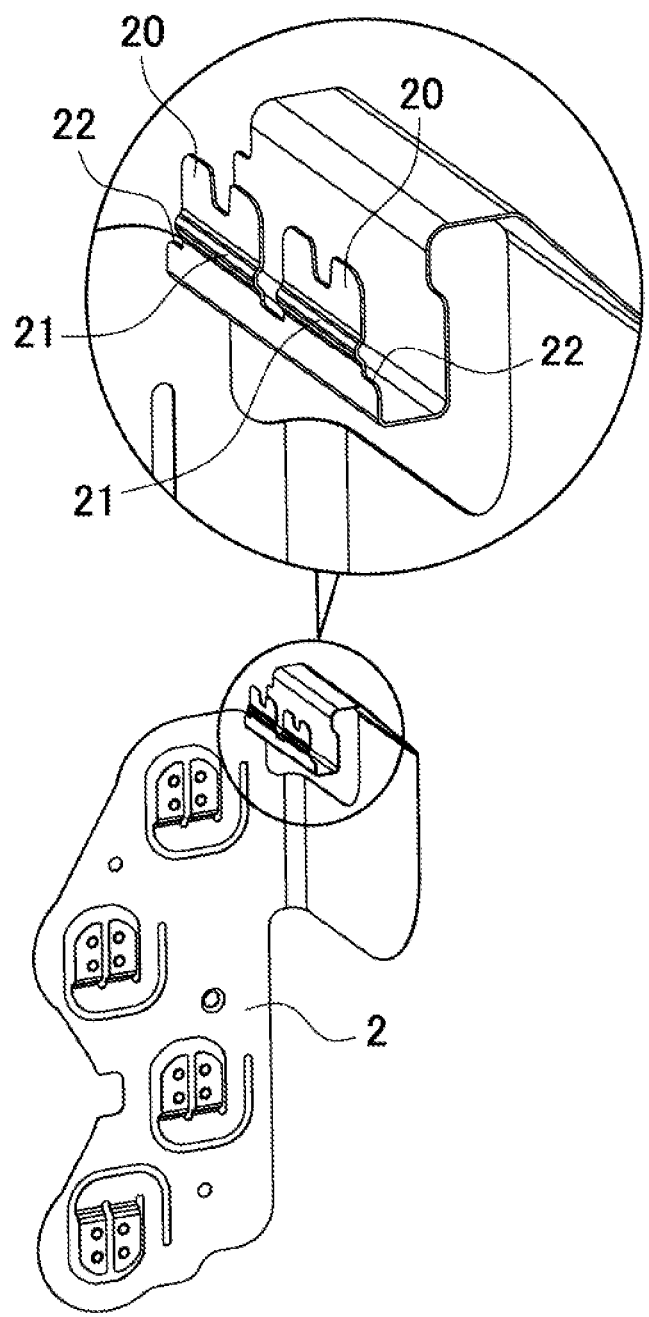
FIG. 5 is a partially enlarged perspective view of the lead plate.

Lead plate 2 is an elastically-deformable metal plate thinner than opening width (W) of slit hole 30, and includes a leading end part provided with insertion section 20 to be inserted into slit hole 30. Lead plate 2 inserted into and soldered to slit holes 30 provided in circuit board 3 includes insertion sections 20 each branched to plural leading end parts. FIG. 3 illustrates circuit board 3 in which two rows of slit holes 30 are linearly aligned, and thus, lead plate 2 includes insertion sections 20 each branched to two leading end parts, as illustrated in FIG. 5.

Lead plate 2 thinner than opening width (W) of slit hole 30 forms a gap between the lead plate and opposing inner surface 32 of slit hole 30 while being inserted into slit hole 30. To reduce the gap between insertion section 20 and opposing inner surface 32 of slit hole 30, insertion section 20 includes bent section 21 approaching from one of opposing inner surfaces 32 of slit hole 30 facing each other toward another of the opposing inner surfaces 32. While insertion section 20 including bent section 21 is inserted into slit hole 30, both surfaces of insertion section 20 approach or contact corresponding opposing inner surfaces 32 of slit hole 30 to reduce a gap between insertion section 20 and each opposing inner surface 32. Bent section 21 is bent to preferably has a shape allowing bent section 21 to be inserted into slit hole 30 and both the surfaces of insertion section 20 to elastically press opposing inner surfaces 32 of slit hole 30. Insertion section 20 reliably closes the gap in slit hole 30 and more reliably prevents the molten solder from flowing down due to both the surfaces of insertion section 20 elastically pressing and contacting opposing surfaces of slit hole 30. Alternatively, bent section 21 does not necessarily have a shape allowing both the surfaces of insertion section 20 to elastically press opposing inner surfaces 32 of slit hole 30. Bent section 21 may be bent to have a shape allowing the surfaces of insertion section 20 to be close to corresponding opposing inner surfaces 32 of slit hole 30 to narrow the gap in slit hole 30. Insertion section 20 including bent section 21 narrowing the gap between insertion section 20 and slit hole 30 is inserted into slit hole 30 of circuit board 3, and is reliably soldered to conductive pattern 31 without dropping molten solder from slit hole 30.

Figure 6:
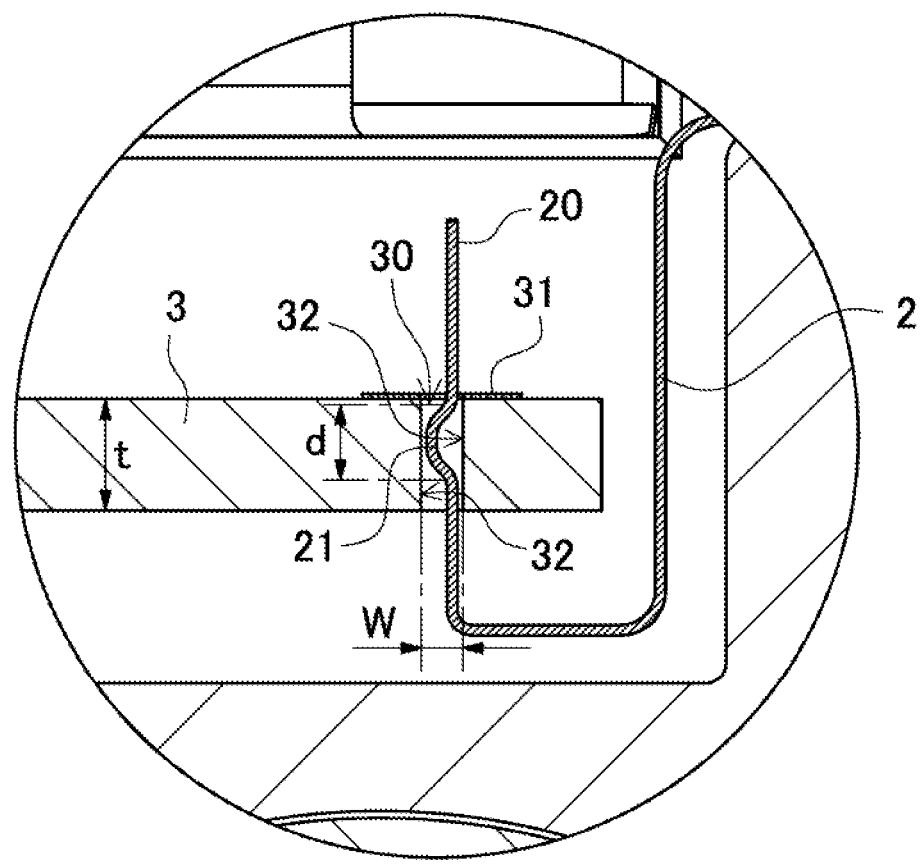
FIG. 6 is an enlarged sectional view illustrating the connecting part between the circuit board and the lead plate, and is a sectional view taken along line VI-VI in FIG. 4.

Insertion section 20 illustrated in the enlarged sectional view of FIG. 6 is includes bent section 21 formed by bending a metal plate to have a chevron shape extending in a longitudinal direction of the inner surface of slit hole 30 having slenderly-extending shape. Bent section 21 bent to have the chevron shape has width (d) smaller than thickness (t) of circuit board 3. A chevron part of the bent section has both sides being close to or contacting one opposing inner surface 32. Insertion section 20 in this drawing includes bent section 21 including the chevron part and side parts across the chevron part. The chevron part has a ridge being close to or contacting one opposing inner surface 32 on the left while the side parts are close to or contact another opposing inner surface 32 on the right in the drawing to reduce a gap between insertion section 20 and each opposing inner surface 32 or to close the gap.

Figure 7:
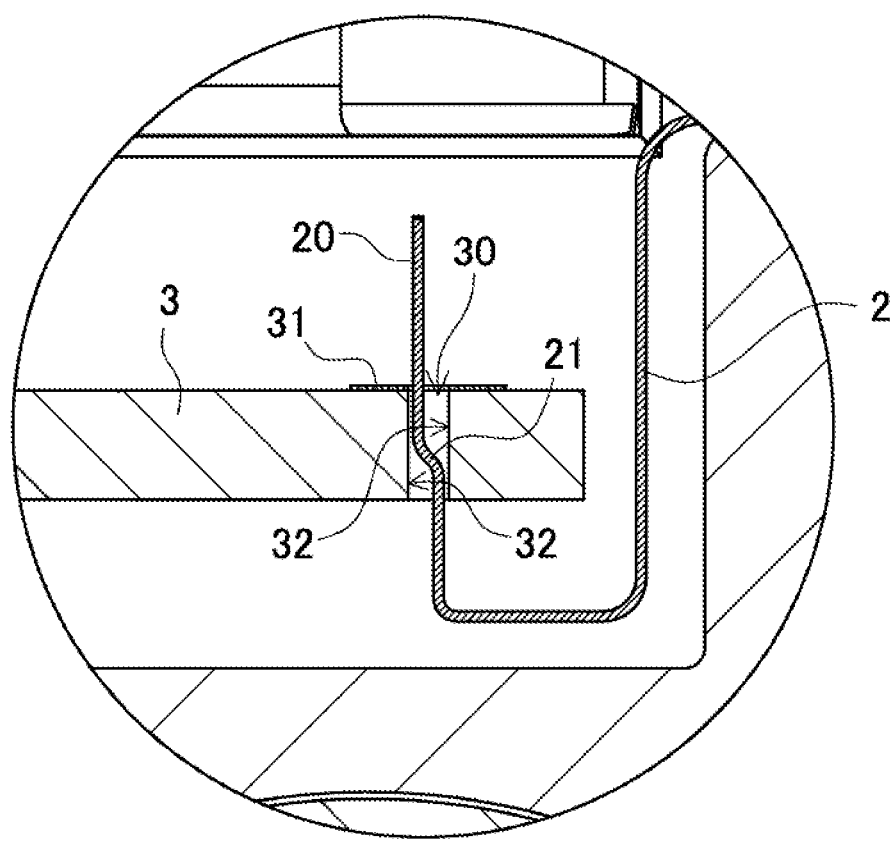
FIG. 7 is an enlarged sectional view illustrating another example of a bent section of the lead plate.

Insertion section 20 illustrated in the sectional view of FIG. 7 includes bent section 21 formed by bending a metal plate to have a stepped shape. Insertion section 20 in this drawing includes an upper part and a lower part across bent section 21. The upper part is close to or contacts one opposing inner surface 32 on the left while the lower part is close to contacts another opposing inner surface 32 on the right in the drawing to reduce a gap between insertion section 20 and each opposing inner surface 32 or to close the gap.

Figure 8:
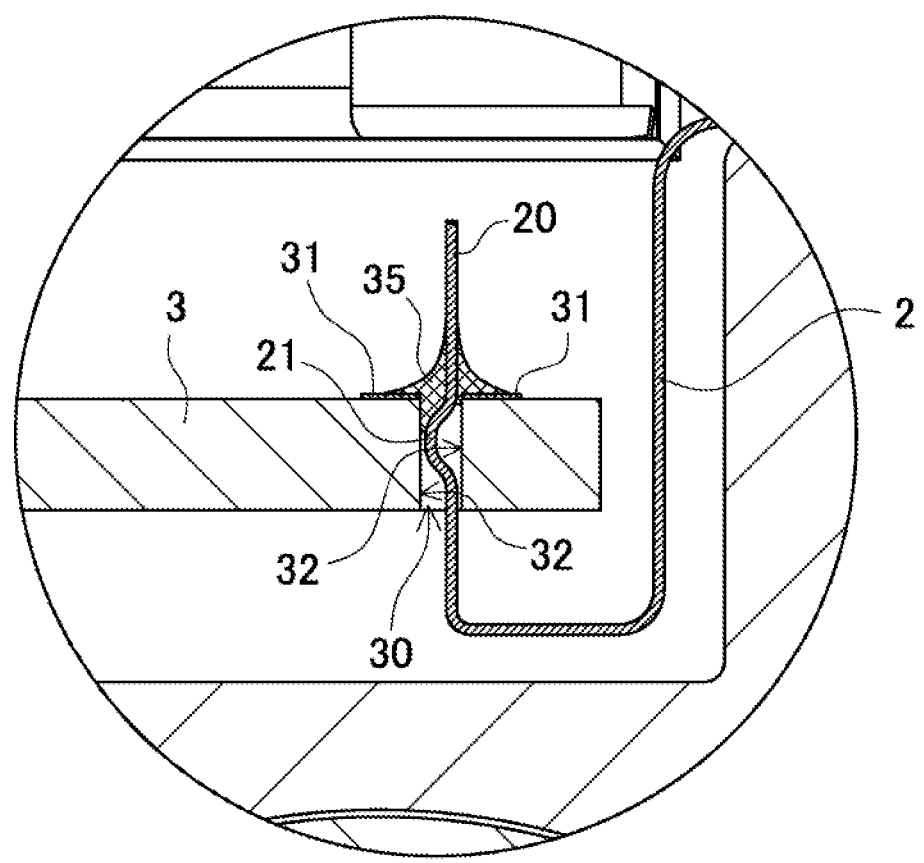
FIG. 8 is an enlarged sectional view illustrating an insertion section of a lead plate, the insertion section being soldered to a conductive pattern of the circuit board.

The enlarged sectional view of FIG. 8 illustrates lead plate 2 that is inserted into slit hole 30 and insertion section 20 of lead plate 2 that is soldered to conductive pattern 31 on circuit board 3. Lead plate 2 illustrated in this drawing is soldered to circuit board 3 with molten solder 35 while bent section 21 provided in insertion section 20 is disposed in slit hole 30. Insertion section 20 illustrated in FIG. 8 has a right side surface and a left side surface in the drawing. The right side surface is close to or contacts opposing inner surface 32 of slit hole 30, and the left side surface including a surface of the chevron part of bent section 21 is close to or contacts opposing inner surface 32 of slit hole 30. In this state, molten solder 35 heated is supplied along a boundary between lead plate 2 and slit hole 30. Molten solder 35 heats lead plate 2 and conductive patterns 31 on circuit board 3, and flows along surfaces of lead plate 2 and conductive patterns 31 to form an alloy layer at an interface between the surfaces of lead plate 2 and conductive patterns 31. Thus, molten solder 35 reliably solders lead plate 2 to conductive patterns 31. Molten solder 35 supplied to the boundary between lead plate 2 and slit hole 30 reliably solders lead plate 2 to conductive pattern 31 without flowing down from slit hole 30 even in a flowable state due to a gap through which molten solder 35 flows down is blocked by bent section 21. This structure preventing molten solder 35 from flowing down allows lead plate 2 and conductive pattern 31 to be heated by molten solder 35 until an alloy layer is formed, so that lead plate 2 may be reliably soldered to conductive pattern 31.

Figure 9:
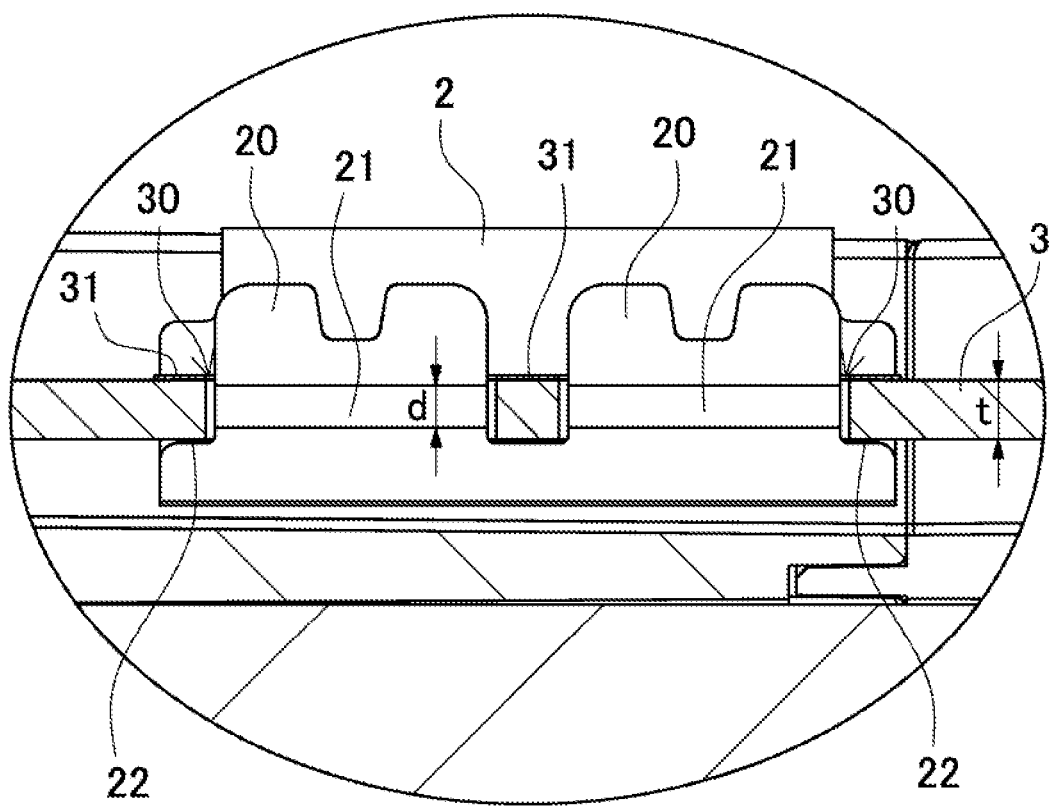
FIG. 9 is an enlarged sectional view illustrating the connecting part between the circuit board and the lead plate, and is a sectional view taken along line IX-IX in FIG. 4.
Figure 10:
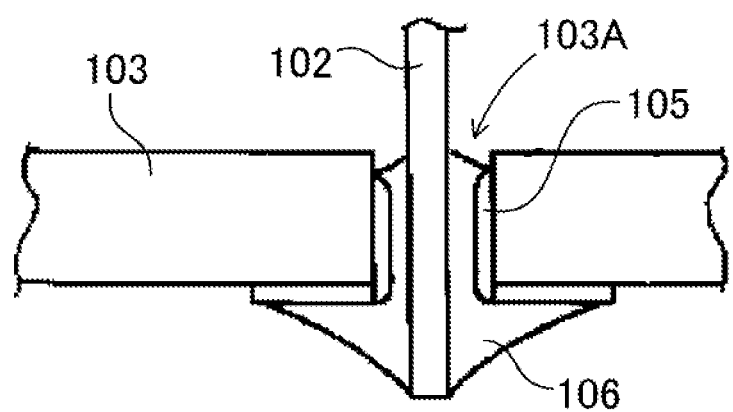
FIG. 10 is a schematic view illustrating an example of a conventional soldering structure.

Lead plate 2 illustrated in FIGS. 5 and 9 further includes placement section 22 to place circuit board 3 at an accurate position. Placement section 22 is provided at a position along a lower surface of circuit board 3 while protruding in the width direction of circuit board 3 while circuit board 3 is placed. Placement section 22 allows circuit board 3 to be disposed at a predetermined position with the lower surface of the circuit board placed on placement section 22. Placement section 22 protrudes from lead plate 2 in the width direction of the board, so that placement section 22 is disposed at a position where an end part of slit hole 30 is closed from below when circuit board 3 is placed on placement section 22. Lead plate 2 allows bent section 21 to be disposed accurately in slit hole 30 by placing circuit board 3 on placement section 22. Placement section 22 closes the gap produced at the end part of slit hole 30 due to insertion section 20 inserted into slit hole 30 from below. Lead plate 2 having this structure has the following advantages. The gap formed on each side of slit hole 30 is closed with bent section 21. The gap formed at the end part of slit hole 30 is closed with placement section 22. This configuration reliably prevents molten solder 35 from flowing down from slit hole 30.

INDUSTRIAL APPLICABILITY

A battery pack according to the present invention is suitably useable as a rechargeable battery pack for devices, such as an assist bicycle, an electric motorcycle, an electric wheelchair, an electric cart, a cleaner, and an electric tool, which are powered with a battery.

REFERENCE MARKS IN THE DRAWINGS 100 battery pack
1 battery
1a, 1b electrode terminal
2 lead plate
3 circuit board
4 battery holder
9 outer case
10 battery unit
20 insertion section
21 bent section
22 placement section
30 slit hole
31 conductive pattern
32 opposing inner surface
35 molten solder
102 metal plate
103 circuit board
103A slit hole
105 metal film
106 soldering

The invention claimed is:
1. A circuit board soldering structure comprising a circuit board having a slit hole provided therein, a conductive pattern provided on the circuit board along the slit hole, and a lead plate inserted into the slit hole of the circuit board, the lead plate being soldered to the conductive pattern, wherein
the lead plate is made of an elastically-deformable metal plate thinner than an opening width of the slit hole,
the lead plate includes an insertion section inserted into the slit hole, the insertion section including a bent section approaching from one of opposing inner surfaces of the slit hole facing each other toward another of the inner surfaces of the slit hole,
the bent section is disposed in the slit hole,
the insertion section has both surfaces that are close to or contact the inner surfaces of the slit hole and soldered to the conductive pattern,
an inclined portion of the bent section which is inclined from a vertical direction in which the opposing inner surfaces of the slit hole extend is located between opposite ends of the slit hole in the vertical direction, and
the insertion section includes a first part and a second part respectively extending from opposite ends of the inclined portion of the bent section in the vertical direction, wherein the first part is closer to the one of the opposing inner surfaces than the another of the opposing inner surfaces of the slit hole, and the second part is closer to the another of the opposing inner surfaces than the one of the opposing inner surfaces of the slit hole.

2. The circuit board soldering structure according to claim 1, wherein the bent section is bent to have a stepped shape.

3. The circuit board soldering structure according to claim 2, wherein the bent section of the lead plate is bent to have a chevron shape, the chevron shape extending in a longitudinal direction of the inner surfaces of the slit hole.

4. The circuit board soldering structure according to claim 3, wherein the bent section having the chevron shape has a lateral width smaller than a thickness of the circuit board.

5. The circuit board soldering structure according to claim 1, wherein the lead plate allows solder to flow into gaps between the lead plate and the corresponding inner surfaces of the slit hole while the bent section causes both the surfaces of the lead plate to elastically press corresponding inner surfaces of the slit hole.

6. The circuit board soldering structure according to claim 1, wherein the circuit board has a plurality of slit holes provided therein and linearly aligned to one another, the lead plate includes a plurality of insertion sections respectively inserted into the plurality of slit holes, and the plurality of insertion sections are inserted into the plurality of slit holes and soldered to the conductive pattern of the circuit board, each of the plurality of insertion sections being inserted into corresponding one of the plurality of slit holes.

7. The circuit board soldering structure according to claim 1, wherein the lead plate includes a placement section for the circuit board, the placement section protruding in a width direction of the circuit board along a lower surface of the circuit board, the circuit board is placed on the placement section, the bent section is disposed in the slit hole, and the placement section is disposed at a position causing the placement section to close an end opening of the slit hole from below.

* * * * *